US012754210B2

(12) United States Patent
Shimizu et al.

(10) Patent No.: US 12,754,210 B2
(45) Date of Patent: Oct. 6, 2026

(54) PROBE HEAD INCLUDING A PROBE SUPPORTED BY A TAPERED HOLE

(71) Applicant: YOKOWO CO., LTD., Tokyo (JP)

(72) Inventors: Yusuke Shimizu, Tomioka (JP); Katsuhiko Sato, Tomioka (JP); Takayoshi Okuno, Tomioka (JP)

(73) Assignee: YOKOWO CO., LTD., Tokyo (JP)

( * ) Notice: Subject to any disclaimer, the term of this patent is extended or adjusted under 35 U.S.C. 154(b) by 142 days.

(21) Appl. No.: 18/721,869

(22) PCT Filed: Nov. 2, 2022

(86) PCT No.: PCT/JP2022/040970
§ 371 (c)(1),
(2) Date: Jun. 20, 2024

(87) PCT Pub. No.: WO2023/119897
PCT Pub. Date: Jun. 29, 2023

(65) Prior Publication Data

US 2025/0060393 A1 Feb. 20, 2025

(30) Foreign Application Priority Data

Dec. 21, 2021 (JP) ................................ 2021-206915

(51) Int. Cl.
*G01R 1/067* (2006.01)

(52) U.S. Cl.
CPC ...... *G01R 1/06733* (2013.01); *G01R 1/06722* (2013.01)

(58) Field of Classification Search
None
See application file for complete search history.

(56) References Cited

U.S. PATENT DOCUMENTS

| | | | | |
|---|---|---|---|---|
| 8,087,956 | B2 | 1/2012 | Nakayama | |
| 8,493,085 | B2 * | 7/2013 | Barabi | G01R 1/06722 324/755.05 |
| 11,821,915 | B2 * | 11/2023 | Nakashima | H01R 12/7076 |
| 2010/0041251 | A1 | 2/2010 | Nakayama | |
| 2024/0295584 | A1 * | 9/2024 | Hosokawa | H01R 33/76 |

FOREIGN PATENT DOCUMENTS

| | | | | |
|---|---|---|---|---|
| CN | 118159850 A | * 6/2024 | | G01R 1/0466 |
| JP | 2006-308486 A | 11/2006 | | |
| JP | 2006300581 A | * 11/2006 | | |
| WO | WO-2011162362 A1 | * 12/2011 | | H10W 72/00 |
| WO | 2020/202735 A1 | 10/2020 | | |

OTHER PUBLICATIONS

International Search Report and Written Opinion mailed on Dec. 20, 2022, received for International Application No. PCT/JP2022/040970, filed on Nov. 2, 2022, 09 pages including English Translation.

* cited by examiner

*Primary Examiner* — Richard Isla
(74) *Attorney, Agent, or Firm* — XSENSUS LLP

(57) ABSTRACT

A probe head including a probe and an insulating support provided with a tapered hole to support a plurality of portions of the probe.

12 Claims, 4 Drawing Sheets

PROBE HEAD INCLUDING A PROBE SUPPORTED BY A TAPERED HOLE

CROSS-REFERENCE TO RELATED APPLICATIONS

The present application is a national stage application, pursuant to 35 U.S.C. § 371, of International Patent Application No. PCT/JP2022/040970, filed Nov. 2, 2022, which claims priority from Japanese Patent Application No. 2021-206915, filed Dec. 21, 2021, the disclosure of each is incorporated herein in its entirety by reference.

TECHNICAL FIELD

The present invention relates to a probe head.

BACKGROUND ART

To inspect an object under inspection such as an integrated circuit, the object under inspection may be electrically connected to an inspection substrate through a probe head. For example, as disclosed in Patent Document 1, a probe head includes a probe and an insulating support provided with a through-hole into which the probe is inserted. The probe includes a first plunger to contact a first electrode of an object under inspection, a second plunger to contact a second electrode of the inspection substrate, and a spring. In an inspection of the object under inspection, the first plunger is contacted with the first electrode of the object under inspection after contacting the second plunger with the second electrode of the inspection substrate and biasing the first plunger upward by the spring.

RELATED DOCUMENT

Patent Document

Patent Document 1: Japanese Laid-open Patent Publication No. 2006-308486

SUMMARY OF THE INVENTION

Technical Problem

To slide the probe in the through-hole of the insulating support, a gap is provided between an outer side surface of the probe and an inner side surface of the through-hole. In the inspection of the object under inspection, the first plunger may be biased upward with the tip of the first plunger opened after contacting the second plunger with the second electrode of the inspection substrate. When the tip of the first plunger is opened, an external force in a direction from the tip of the first plunger toward a base of the first plunger on an opposite side of the tip of the first plunger is not applied to the tip of the first plunger. In this case, however, the first plunger may be inclined to cause deterioration of the positional accuracy of the tip of the first plunger.

An example of an object of the present invention is to improve the positional accuracy of a tip of a probe. Other objects of the invention will become apparent from the description of the present specification.

Solution to Problem

An aspect of the present invention is a probe head including a probe and an insulating support provided with a tapered hole to support a plurality of portions of the probe.

According to the above aspect of the present invention, the positional accuracy of a tip of a probe can be improved.

DESCRIPTION OF EMBODIMENTS

Hereinafter, an embodiment of the present invention will be described with reference to the drawings. In all drawings, similar components are denoted by the similar reference signs, and description thereof will not be repeated as appropriate.

In the present specification, ordinal numbers such as "first", "second", and "third" are added to simply distinguish components having similar names unless otherwise specified, and do not mean the particular feature of the component (for example, order or importance).

Figure 1:
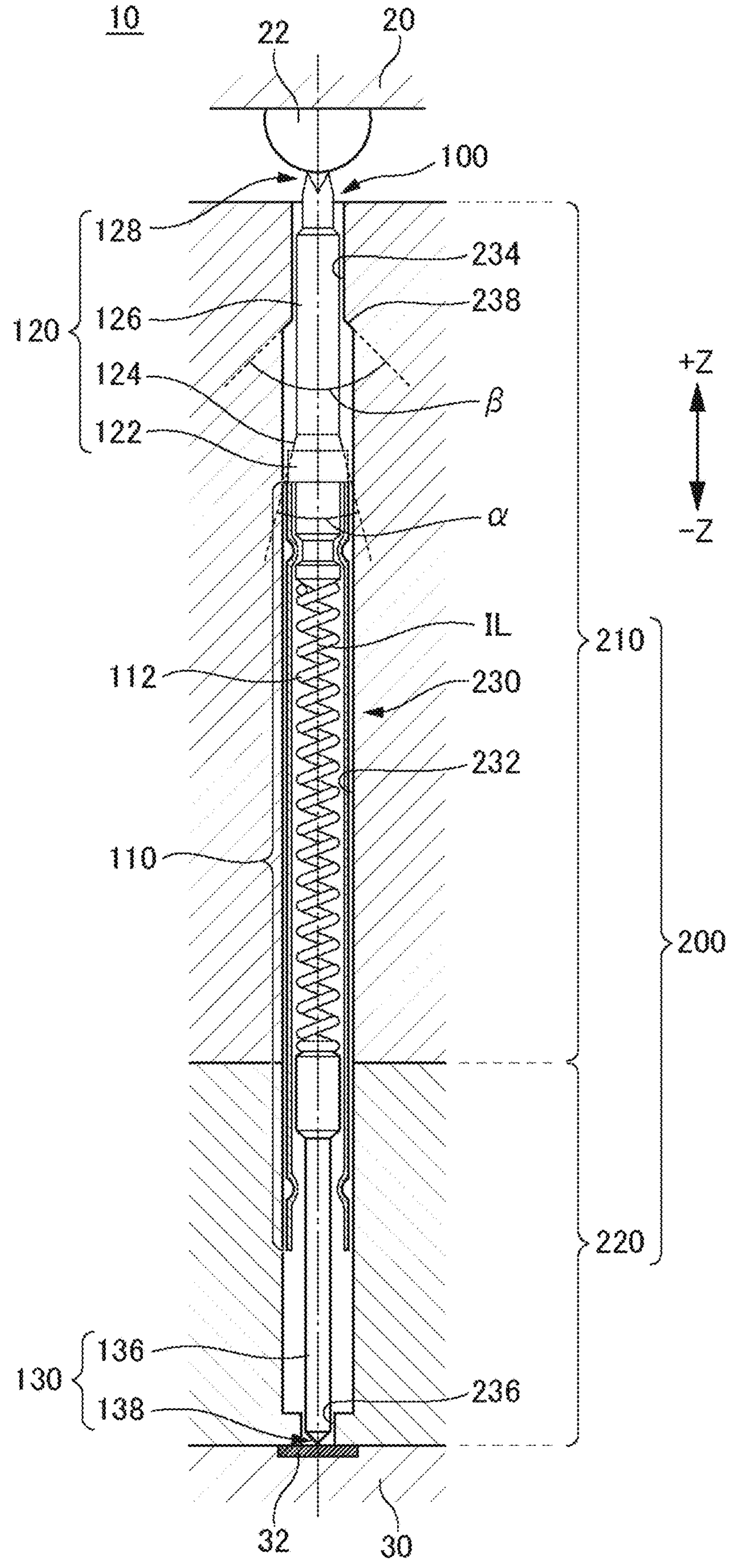
FIG. 1 A cross-sectional view of a probe head according to an embodiment.

FIG. 1 is a cross-sectional view of a probe head 10 according to an embodiment.

In FIG. 1, an arrow with "+Z" attached thereto indicates an upward direction in the vertical direction and an arrow with "−Z" attached thereto indicates a downward direction in the vertical direction. Hereinafter, as necessary, a direction orthogonal to the vertical direction will be referred to as a horizontal direction. The same applies to FIGS. 2 to 4.

The probe head 10 is located between an object under inspection 20 and an inspection substrate 30 in the vertical direction. The object under inspection 20 is located above the probe head 10. The inspection substrate 30 is located below the probe head 10. The object under inspection 20 is, for example, an integrated circuit.

The probe head 10 includes a conductive probe 100 and an insulating support 200. A first electrode 22 provided on a lower surface of the object under inspection 20 and a second electrode 32 provided on an upper surface of the inspection substrate 30 are electrically connected to each other through the probe 100. In the present embodiment, the first electrode 22 is a bump, and the second electrode 32 is a pad. The probe 100 includes a tube 110, a spring 112, a first plunger 120, and a second plunger 130. The first plunger 120 includes a flange 122, a tapered portion 124, a first column portion 126, and a first contact portion 128. The second plunger 130 includes a second column portion 136 and a second contact portion 138. The insulating support 200 includes a first insulating support 210 and a second insulating support 220.

The tube 110 extends parallel to the vertical direction. The first plunger 120 is provided at an upper end of the tube 110.

The second plunger 130 is provided at a lower end of the tube 110. The spring 112 is provided in the tube 110. The spring 112 biases the first plunger 120 and the second plunger 130 away from each other in the vertical direction. In another example different from the present embodiment, the spring 112 may be provided between the first plunger 120 and the second plunger 130 in the vertical direction without the tube 110.

The flange 122 is located above an upper end of the tube 110. The value of the diameter of the flange 122 in the horizontal direction is substantially equal to the value of the outer diameter of the tube 110 in the horizontal direction.

The tapered portion 124 is located above an upper end of the flange 122. The value of the diameter of the tapered portion 124 in the horizontal direction decreases from the lower side toward the upper side. A first tapered angle α shown in FIG. 1 indicates a tapered angle of the tapered portion 124. The first tapered angle α is a total of angles formed by both outer side surfaces of the tapered portion 124 in the horizontal direction with respect to a virtual line IL passing parallel to an extension direction of the first plunger 120 through the center of the tapered portion 124 in the horizontal direction. The first tapered angle α is also an angle formed by tangent lines of both outer side surfaces of the tapered portion 124 in the horizontal direction.

The first column portion 126 extends upward from the upper end of the tapered portion 124 in the vertical direction. The value of the diameter of the first column portion 126 in the horizontal direction is substantially equal to the value of the diameter of the upper end of the tapered portion 124 in the horizontal direction. The value of the diameter of the first column portion 126 in the horizontal direction is less than the value of the diameter of the flange 122 in the horizontal direction.

The first contact portion 128 is provided at the tip of the first column portion 126. In the example shown in FIG. 1, the tip of the first column portion 126 is the upper end of the first column portion 126. In the inspection of the object under inspection 20, the first contact portion 128 is in contact with the first electrode 22 with the tube 110 and the first plunger 120 integrally biased toward the object under inspection 20 by the spring 112.

The second column portion 136 extends in the vertical direction. The value of the diameter of the second column portion 136 in the horizontal direction is less than the value of the inner diameter of the tube 110 in the horizontal direction. The second column portion 136 is attached to the tube 110 to be movable in the vertical direction with at least a portion of the second column portion 136 inserted into a hole provided at the lower end of the tube 110.

The second contact portion 138 is provided at the tip of the second column portion 136. In the example shown in FIG. 1, the tip of the second column portion 136 is the lower end of the second column portion 136. In the inspection of the object under inspection 20, the second contact portion 138 is in contact with the second electrode 32 with the second plunger 130 biased toward the inspection substrate 30 by the spring 112.

The first insulating support 210 and the second insulating support 220 overlap in the vertical direction. The first insulating support 210 is located above the second insulating support 220. The second insulating support 220 is located below the first insulating support 210. The first insulating support 210 is, for example, a pin block, and the second insulating support 220 is, for example, a pin plate.

The insulating support 200 is provided with a through-hole 230. The through-hole 230 extends through the insulating support 200 in the vertical direction. The through-hole 230 includes a first through-hole 232, a second through-hole 234, a third through-hole 236, and a tapered hole 238. At least a portion of the probe 100 is inserted into the through-hole 230 in the vertical direction.

The first through-hole 232 extends through a portion of the first insulating support 210 located below the second through-hole 234 and a portion of the second insulating support 220 located above the third through-hole 236 in the vertical direction through the tapered hole 238. In the example shown in FIG. 1, the first through-hole 232 extends through the lower end of the first insulating support 210, the central portion of the first insulating support 210 in the vertical direction, and the upper end of the second insulating support 220 in the vertical direction through the tapered hole 238. A portion of the first through-hole 232 extending through the lower end of the first insulating support 210 and a portion of the first through-hole 232 extending through the upper end of the second insulating support 220 communicate with each other in the vertical direction. At least a portion of the tube 110 and at least a portion of the flange 122 are inserted into the first through-hole 232 in the vertical direction. The value of the diameter of the first through-hole 232 in the horizontal direction is greater than both the value of the outer diameter of the tube 110 in the horizontal direction and the value of the diameter of the flange 122 in the horizontal direction. Thus, a gap is provided between the outer side surface of the tube 110 and the side inner side surface of the first through-hole 232 and between the outer side surface of the flange 122 and the inner side surface of the first through-hole 232. For this reason, the tube 110 and the flange 122 are slidable in the first through-hole 232 in the vertical direction.

The second through-hole 234 extends through the upper end of the first insulating support 210 in the vertical direction. The lower end of the second through-hole 234 communicates with the upper end of the first through-hole 232 in the vertical direction through the tapered hole 238. At least a portion of the first column portion 126 is inserted into the second through-hole 234 in the vertical direction. The value of the diameter of the second through-hole 234 in the horizontal direction is less than a value of the diameter of the first through-hole 232 in the horizontal direction. The value of the diameter of the second through-hole 234 in the horizontal direction is equal to or less than the value of the outer diameter of the tube 110 in the horizontal direction, is equal to or less than the value of the diameter of the flange 122 in the horizontal direction and is greater than the value of the diameter of the first column portion 126 in the horizontal direction. Thus, the tube 110 and the flange 122 are suppressed from escaping upward through the second through-hole 234. A gap is provided between the outer side surface of the first column portion 126 and the inner side surface of the second through-hole 234. For this reason, the first column portion 126 is slidable in the second through-hole 234 in the vertical direction. The first column portion 126 is also guided in the vertical direction by the second through-hole 234.

The third through-hole 236 extends through the lower end of the second insulating support 220 in the vertical direction. The upper end of the third through-hole 236 communicates with the lower end of the first through-hole 232 in the vertical direction. At least a portion of the second column portion 136 is inserted into the third through-hole 236 in the vertical direction. The value of the diameter of the third through-hole 236 in the horizontal direction is less than the value of the diameter of the first through-hole 232 in the horizontal direction. The value of the diameter of the third through-hole 236 in the horizontal direction is equal to or less than the value of the outer diameter of the tube 110 in the horizontal direction and is greater than the value of the diameter of the second column portion 136 in the horizontal direction. Thus, the tube 110 is suppressed from escaping downward through the third through-hole 236. A gap is provided between the outer side surface of the second column portion 136 and the inner side surface of the third through-hole 236. For this reason, the second column portion 136 is slidable in the third through-hole 236 in the vertical direction. The second column portion 136 is also guided in the vertical direction by the third through-hole 236.

The tapered hole 238 is located between the upper end of the first through-hole 232 and the lower end of the second through-hole 234 in the vertical direction. A depth direction of the tapered hole 238 is substantially parallel to the vertical direction. The value of the diameter of the tapered hole 238 in the horizontal direction decreases from the upper end of the first through-hole 232 toward the lower end of the second through-hole 234. The value of the diameter of the lower end of the tapered hole 238 in the horizontal direction is substantially equal to the value of the diameter of the upper end of the first through-hole 232 in the horizontal direction. The value of the diameter of the upper end of the tapered hole 238 in the horizontal direction is substantially equal to the value of the diameter of the lower end of the second through-hole 234 in the horizontal direction. A second tapered angle β shown in FIG. 1 indicates a tapered angle of the tapered hole 238. The second tapered angle β is a total of angles formed by both inner side surfaces of the tapered hole 238 in the horizontal direction with respect to the virtual line IL passing parallel to the extension direction of the through-hole 230 through the center of the through-hole 230 in the horizontal direction. The second tapered angle β is also an angle formed by tangent lines of both inner side surfaces of the tapered hole 238 in the horizontal direction.

Figure 2:
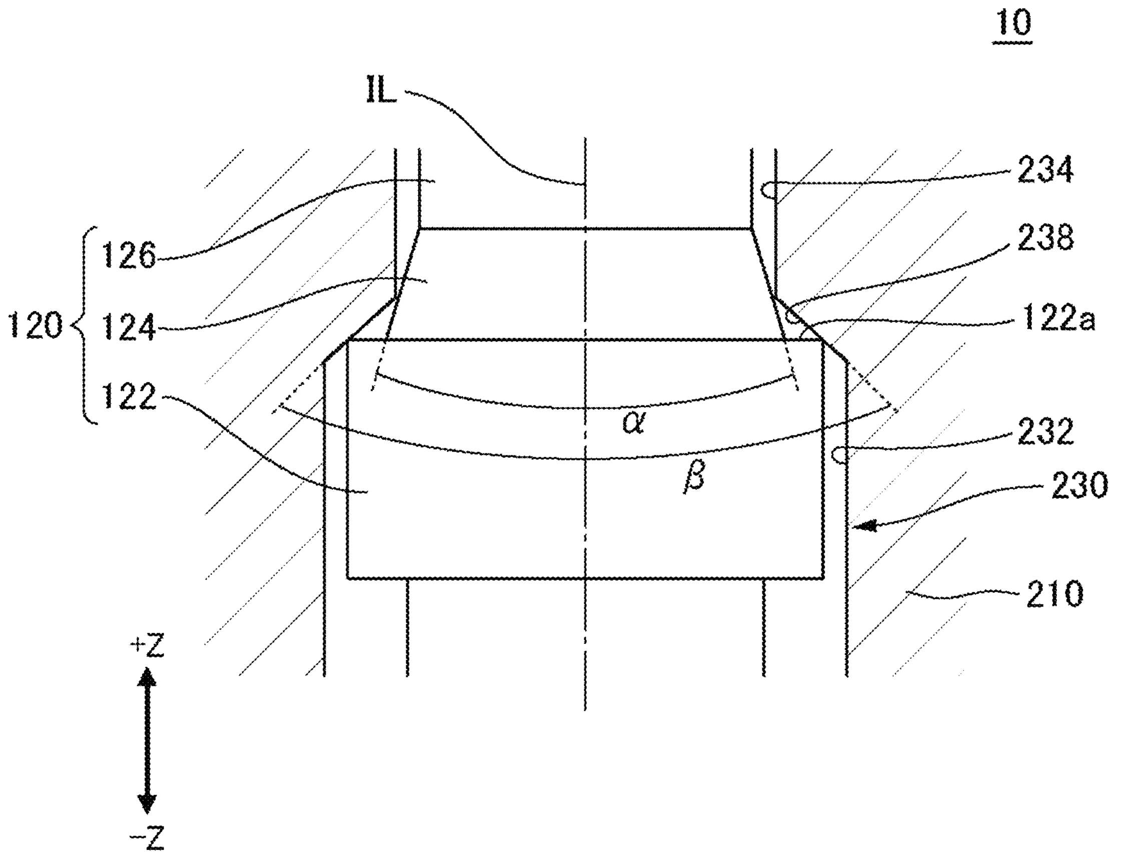
FIG. 2 A diagram for illustrating a probe head according to the embodiment with a tip of a first plunger opened and the first plunger biased upward.

FIG. 2 is a diagram for illustrating the probe head 10 according to the embodiment with the tip of the first plunger 120 opened and the first plunger 120 biased upward.

The embodiment shown in FIG. 2 will be described with reference to FIG. 1. The upper end of the first contact portion 128 is referred to as the tip of the first plunger 120 below as necessary.

In the embodiment shown in FIG. 2, the second contact portion 138 is in contact with the second electrode 32 with the tip of the first plunger 120 opened. When the tip of the first plunger 120 is opened, the tip of the first plunger 120 is not in contact with an object such as the first electrode 22 and an external force in the downward direction is not applied to the tip of the first plunger 120. In the embodiment shown in FIG. 2, the tube 110 and the first plunger 120 are integrally biased upward by the spring 112 and the first plunger 120 is pushed upward.

When the tip of the first plunger 120 is opened and the first plunger 120 is biased upward, the tapered hole 238 supports a plurality of portions offset from each other in the vertical direction of the first plunger 120 (at different positions in an axial direction of the first plunger 120). In the embodiment, the tapered hole 238 supports two portions of the tapered portion 124 and the flange 122.

The support of the tapered portion 124 by the tapered hole 238 will be described.

The first tapered angle α is less than the second tapered angle β. The value of the diameter of the upper end of the tapered portion 124 in the horizontal direction is less than the value of the diameter of the upper end of the tapered hole 238 in the horizontal direction. The value of the diameter of the lower end of the tapered portion 124 in the horizontal direction is equal to or greater than the value of the diameter of the upper end of the tapered hole 238 in the horizontal direction. For this reason, the outer side surface of the tapered portion 124 is contactable with the edge between the upper end of the tapered hole 238 and the lower end of the second through-hole 234 with the tip of the first plunger 120 opened and the first plunger 120 biased upward. The tapered hole 238 can support the tapered portion 124 with the first plunger 120 substantially parallel to the vertical direction as the outer side surface of the tapered portion 124 contacts the edge between the upper end of the tapered hole 238 and the lower end of the second through-hole 234 with the first plunger 120 substantially parallel to the vertical direction.

In the example shown in FIG. 2, the outer side surface of the tapered portion 124 is in contact with the edge between the upper end of the tapered hole 238 and the lower end of the second through-hole 234 over the entire circumference of the tapered portion 124 when viewed in the vertical direction. For this reason, both outer side surfaces of the tapered portion 124 in the horizontal direction in the cross section shown in FIG. 2, for example, are in contact with the edge between the upper end of the tapered hole 238 and the lower end of the second through-hole 234 on both sides of the tapered hole 238 in the horizontal direction. When the first plunger 120 is inclined with respect to the vertical direction, however, the outer side surface of the tapered portion 124 may contact the edge between the upper end of the tapered hole 238 and the lower end of the second through-hole 234 only in a portion of the entire circumference of the tapered portion 124 when viewed in the vertical direction. When the first plunger 120 is inclined with respect to the vertical direction in the cross section shown in FIG. 2, for example, only one of both outer side surfaces of the tapered portion 124 in the horizontal direction may contact the edge between the upper end of the tapered hole 238 and the lower end of the second through-hole 234 on only one of both the sides of the tapered hole 238 in the horizontal direction.

The support of the flange 122 by the tapered hole 238 will be described.

The value of the diameter of the upper end of the flange 122 in the horizontal direction is greater than the value of the diameter of the lower end of the tapered portion 124 in the horizontal direction. That is, the flange 122 is a wide portion having a width wider than the lower end of the tapered portion 124 in the horizontal direction. For this reason, a step in the horizontal direction is formed between the lower end of the tapered portion 124 and the upper end of the flange 122. Thus, the edge between the upper surface and the outer side surface of the flange 122 is located outward of the lower end of the outer side surface of the tapered portion 124 with respect to the center of the first plunger 120 in the horizontal direction.

The value of the diameter of the upper end of the flange 122 in the horizontal direction is equal to or greater than the value of the diameter of the upper end of the tapered hole 238 and is less than the value of the diameter of the lower end of the tapered hole 238. For this reason, the edge between the upper surface and the outer side surface of the flange 122 is contactable with the inner side surface of the tapered hole 238 with the tip of the first plunger 120 opened and the first plunger 120 biased upward. The tapered hole 238 can support the flange 122 with the first plunger 120 substantially parallel to the vertical direction as the edge between the upper surface and the outer side surface of the flange 122 contacts the inner side surface of the tapered hole 238 with the first plunger 120 substantially parallel to the vertical direction.

The upper surface of the flange 122 has an increased diameter region 122*a*. The increased diameter region 122*a* is located between the lower end of the entire circumference of the tapered portion 124 and the outer side surface of the entire circumference of the flange 122 when viewed in the vertical direction. In the increased diameter region 122*a*, the diameter of the flange 122 in the horizontal direction is increased from the lower end of the tapered portion 124 to the outer side surface of the flange 122. At least a portion of the increased diameter region 122*a* is located below the upper end of the tapered hole 238 and above the lower end of the tapered hole 238 in the vertical direction. In the cross section shown in FIG. 2, for example, at least a portion of the increased diameter region 122*a* on both sides with respect to the virtual line IL is located below the upper end of the tapered hole 238 on both sides with respect to the virtual line IL and above the lower end of the tapered hole 238 on both sides with respect to the virtual line IL in the vertical direction.

In the example shown in FIG. 2, the edge between the upper surface and the outer side surface of the flange 122 is in contact with the inner side surface of the tapered hole 238 over the entire circumference of the flange 122 when viewed in the vertical direction. For this reason, the edge between the upper surface and the outer side surface of the flange 122 on both sides in the horizontal direction in the cross section shown in FIG. 2, for example, is in contact with the inner side surface of the tapered hole 238 on both sides of the tapered hole 238 in the horizontal direction. When the first plunger 120 is inclined with respect to the vertical direction, however, the edge between the upper surface and the outer side surface of the flange 122 may contact the inner side surface of the tapered hole 238 only in a portion of the entire circumference of the flange 122 when viewed in the vertical direction. When the first plunger 120 is inclined with respect to the vertical direction in the cross section shown in FIG. 2, for example, the edge between the upper surface and the outer side surface of the flange 122 on only one of both the sides in the horizontal direction may contact the inner side surface of the tapered hole 238 on only one of both the sides of the tapered hole 238 in the horizontal direction.

In the example shown in FIG. 2, a peripheral portion of the lower end of the tapered portion 124 of the upper surface of the flange 122 in the horizontal direction is substantially parallel to the horizontal direction. In other words, the increased diameter region 122*a* is substantially parallel to the horizontal direction. If the increased diameter region 122*a* is inclined with respect to the horizontal direction, the variation in the inclination of the increased diameter region 122*a* may be relatively large because the width of the increased diameter region 122*a* in the horizontal direction is relatively narrow. If the increased diameter region 122*a* is inclined with respect to the horizontal direction, the variation in the measurement of the first plunger 120 may be relatively large because the width of the increased diameter region 122*a* in the horizontal direction is relatively narrow. When the increased diameter region 122*a* is substantially parallel to the horizontal direction, on the other hand, the variation in the inclination and the variation in the measurement can be reduced as compared with when the increased diameter region 122*a* is inclined with respect to the horizontal direction. Thus, the first plunger 120 is easily processed when the increased diameter region 122*a* is substantially parallel to the horizontal direction as compared with when the increased diameter region 122*a* is inclined with respect to the horizontal direction. The shape of the peripheral portion of the lower end of the tapered portion 124 of the upper surface of the flange 122 in the horizontal direction, however, is not limited to the example shown in FIG. 2. The peripheral portion of the lower end of the tapered portion 124 of the upper surface of the flange 122 in the horizontal direction may be, for example, a tapered shape. The value of the diameter of the tapered shape in the horizontal direction decreases from the lower side to the upper side. The tapered angle of the tapered shape is greater than the first tapered angle α.

Figure 3:
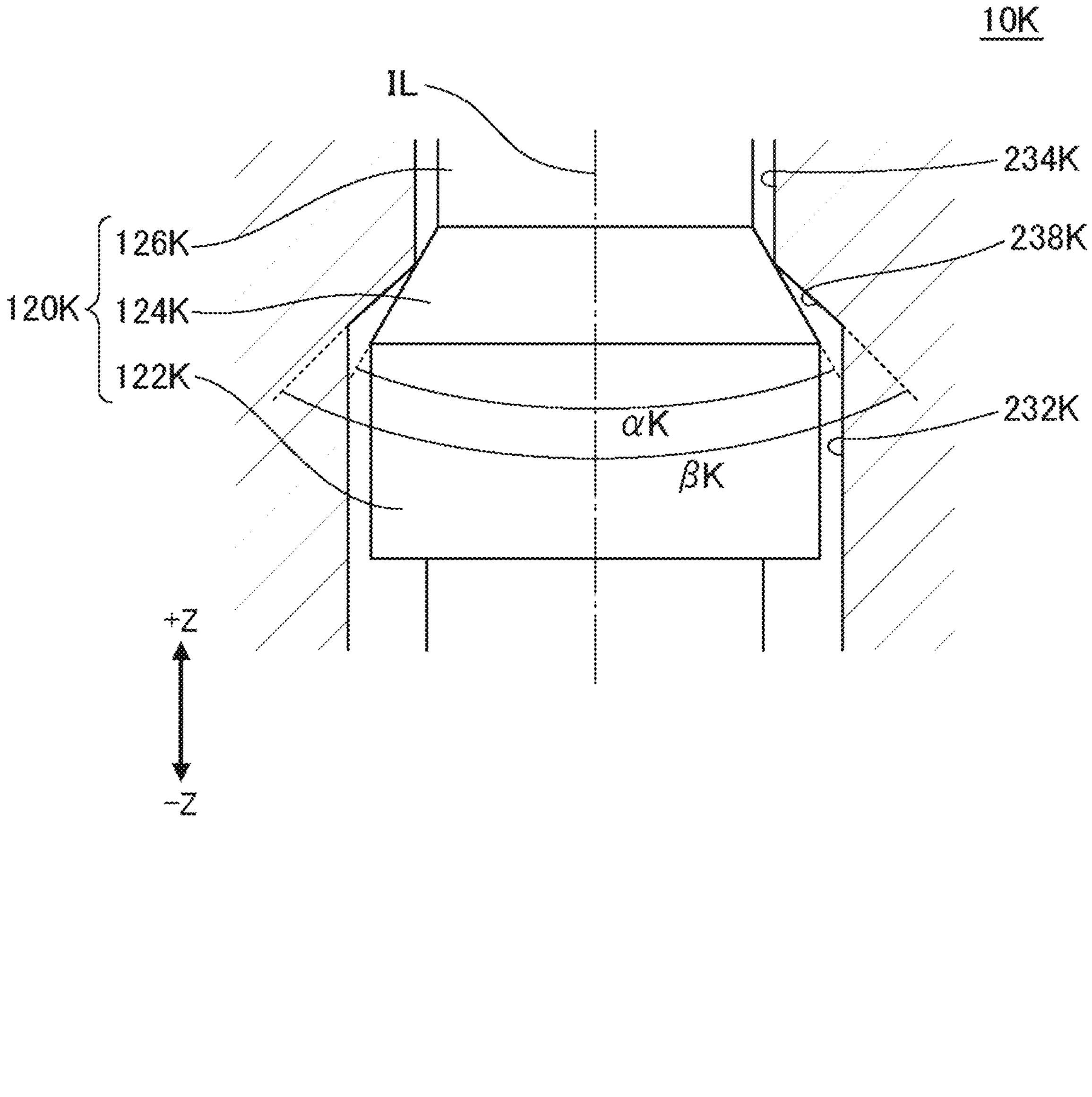
FIG. 3 A diagram for illustrating a probe head according to a comparative example with a tip of a first plunger opened and the first plunger biased upward.

FIG. 3 is a diagram for illustrating a probe head 10K according to a comparative example with a first plunger 120K opened and the first plunger 120K biased upward. The probe head 10K according to the comparative example is similar to the probe head 10 according to the embodiment except for the following points.

The value of the diameter of the upper end of a flange 122K in the horizontal direction according to the comparative example is substantially equal to the value of the diameter of the lower end of a tapered portion 124K in the horizontal direction. For this reason, a step in the horizontal direction is not formed between the lower end of the tapered portion 124K and the upper end of the flange 122K.

A tapered hole 238K according to the comparative example supports only one portion of the first plunger 120K in the vertical direction. Specifically, in the comparative example, a first tapered angle αK of the tapered portion 124K is less than a second tapered angle βK of the tapered hole 238K. The value of the diameter of the upper end of the tapered portion 124K in the horizontal direction is less than the value of the diameter of the upper end of the tapered hole 238K in the horizontal direction. The value of the diameter of the lower end of the tapered portion 124K in the horizontal direction is equal to or greater than the value of the diameter of the upper end of the tapered hole 238K in the horizontal direction. For this reason, the outer side surface of the tapered portion 124K is contactable with an edge between the upper end of the tapered hole 238K and the lower end of a second through-hole 234K with the tip of the first plunger 120K opened and the first plunger 120K biased upward. The lower end of the second through-hole 234K communicates with the upper end of the first through-hole 232K through the tapered hole 238K in the vertical direction. A first column portion 126K extends upward in the vertical direction from the upper end of the tapered portion 124K.

In the example shown in FIG. 3, the outer side surface of the tapered portion 124K is in contact with the edge between the upper end of the tapered hole 238K and the lower end of the second through-hole 234K over the entire circumference of the tapered portion 124K when viewed in the vertical direction. For this reason, both outer side surfaces of the tapered portion 124K in the horizontal direction in the cross section shown in FIG. 3, for example, are in contact with the edge between the upper end of the tapered hole 238K and the lower end of the second through-hole 234K on both sides of the tapered hole 238K in the horizontal direction. When the first plunger 120K is inclined with respect to the vertical direction, however, the outer side surface of the tapered portion 124K may contact the edge between the upper end of the tapered hole 238K and the lower end of the second through-hole 234K only in a portion of the entire circumference of the tapered portion 124K when viewed in the vertical direction. When the first plunger 120K is inclined with respect to the vertical direction in the cross section shown in FIG. 3, for example, only one of both outer side surfaces of the tapered portion 124K in the horizontal direction may contact the edge between the upper end of the tapered hole 238K and the lower end of the second through-hole 234K on only one of both the sides of the tapered hole 238K in the horizontal direction.

In the cross section shown in FIG. 3, two portions of the both outer side surfaces of the tapered portion 124K in the horizontal direction are in contact with two portions of the edge between the upper end of the tapered hole 238K and the lower end of the second through-hole 234K on both sides of the tapered hole 238K in the horizontal direction. In the example shown in FIG. 3, however, the outer side surface of the tapered portion 124K is in contact with the edge between the upper end of the tapered hole 238K and the lower end of the second through-hole 234K over the entire circumference of the tapered portion 124K when viewed in the vertical direction as described above. For this reason, a portion of the first plunger 120K supported by the tapered hole 238K according to the comparative example is not present in more than one in the vertical direction but is present in only one in the vertical direction.

The embodiment shown in FIG. 2 and the comparative example shown in FIG. 3 are compared.

In the comparative example shown in FIG. 3, the tapered hole 238K supports only one portion of the first plunger 120K in the vertical direction with the tip of the first plunger 120K opened and the first plunger 120K biased upward as described above. In the embodiment shown in FIG. 2, on the other hand, the tapered hole 238 supports a plurality of portions of the first plunger 120 in the vertical direction with the tip of the first plunger 120 opened and the first plunger 120 biased upward as described above. Accordingly, the first plunger 120 can be less prone to incline with respect to the vertical direction with the tip of the first plunger 120 opened and the first plunger 120 biased upward in the embodiment as compared with the comparative example. For this reason, the positional accuracy of the tip of the first plunger 120 can be improved in the embodiment as compared with the comparative example.

In the embodiment, the outer side surface of the tapered portion 124 is contactable with the edge between the upper end of the tapered hole 238 and the lower end of the second through-hole 234 over the entire circumference of the tapered portion 124 when viewed in the vertical direction. Further, in the embodiment, the edge between the upper surface and the outer side surface of the flange 122 in at least a portion of the entire circumference of the flange 122 is contactable with the inner side surface of the tapered hole 238 when viewed in the vertical direction. Accordingly, the tapered hole 238 may contact only one of the outer side surface of the tapered portion 124 and the edge between the upper surface and the outer side surface of the flange 122 or may contact both the outer side surface of the tapered portion 124 and the edge between the upper surface and the outer side surface of the flange 122. In either case, the positional accuracy of the tip of the first plunger 120 can be improved in the embodiment as compared with the comparative example.

In the embodiment, the positional accuracy of the tip of the first plunger 120 tends to be relatively improved when the position of a contact portion between the tapered hole 238 and the tapered portion 124 in the vertical direction and the position of a contact portion between the tapered hole 238 and the flange 122 in the vertical direction are relatively close to each other in the vertical direction. The position of the contact portion between the tapered hole 238 and the tapered portion 124 in the vertical direction and the position of the contact portion between the tapered hole 238 and the flange 122 in the vertical direction can be close to each other in the vertical direction by appropriately designing the dimensions and shapes of the respective portions of the first plunger 120 and the dimensions and shapes of the respective portions of the through-hole 230.

In the embodiment, the dimensions of the respective portions of the first plunger 120 and the dimensions of the respective portions of the through-hole 230 are not particularly limited.

A ratio of the first tapered angle α with respect to the second tapered angle β may be ⅙ or greater and ⅔ or less, for example. The first tapered angle α may be, for example, 20° or greater and 40° or less. The second tapered angle β may be, for example, 60° or greater and 120° or less.

Figure 4:
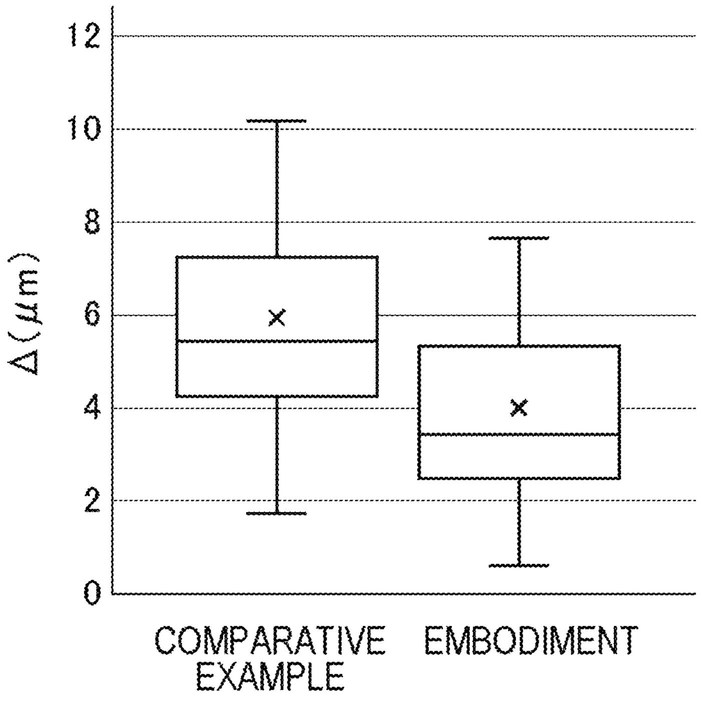
FIG. 4 A graph showing a box plot of results of repeated measurements of deviation Δ from a design position of a position of the tip of the first plunger according to the embodiment and a box plot of results of repeated measurements of deviation Δ of a design position of a position of the tip of the first plunger according to the comparative example.

FIG. 4 is a graph showing a box plot of results of repeated measurements of deviation α from a design position of the position of the tip of the first plunger 120 according to the embodiment and a box plot of results of repeated measurements of deviation α of a design position of the position of the tip of the first plunger 120K according to the comparative example. In FIG. 4, the left box plot shows the results of the repeated measurements of the deviation Δ of the position of the tip of the first plunger 120K from the design position with the tip of the first plunger 120K opened and the first plunger 120K biased upward in the probe head 10K according to the comparative example. In FIG. 4, the right box plot shows the results of the repeated measurements of the deviation Δ of the position of the tip of the first plunger 120 from the design position with the tip of the first plunger 120 opened and the first plunger 120 biased upward in the probe head 10 according to the embodiment.

In FIG. 4, the horizontal line drawn at the lower end of the whisker extending downward from the bottom of the box in each box plot indicates the minimum value of the deviation Δ in the repeated tests of each box plot. The bottom of the box of each box plot indicates the first quartile of the deviation Δ in the repeated tests of each box plot. The horizontal line drawn inside the box of each box plot indicates the median value of the deviation Δ in the repeated tests of each box plot. The top of the box in each box plot indicates the third quartile of the deviation Δ in the repeated tests of each box plot. The horizontal line drawn at the upper end of the whisker extending upward from the top of the box in each box plot indicates the maximum value of the deviation Δ in the repeated tests of each box plot. The "X" mark inside each box plot indicates the average value of the deviation Δ in the repeated tests of each box plot.

The vertical axis of the graph shown in FIG. 4 indicates the deviation Δ (unit: μm). The deviation Δ is determined by the following Expression (1).

$$\Delta=\{(\Delta x)^2+(\Delta y)^2\}^{1/2} \quad (1)$$

In the embodiment, Δx indicates a horizontal deviation of the tip of the first plunger 120 from the design position with the tip of the first plunger 120 opened and the first plunger 120 biased upward. In the embodiment, Δy indicates a vertical deviation of the tip of the first plunger 120 from the design position with the tip of the first plunger 120 opened and the first plunger 120 biased upward. In the embodiment, the design position of the tip of the first plunger 120 is a position of the tip of the first plunger 120 when the first plunger 120 is parallel to the vertical direction with the tip of the first plunger 120 opened and the first plunger 120 biased upward. The same applies to the deviation Δ in the comparative example.

In the repeated measurements according to the embodiment, the first tapered angle α was 30°. The second tapered angle β was 90°.

In the repeated measurements according to the comparative example, the first tapered angle αK was 60°. The second tapered angle βK was 90°.

In the repeated measurements according to the embodiment, the tip of the first plunger 120 is opened in advance with the second contact portion 138 in contact with the second electrode 32. Then, a force for pushing the first plunger 120 downward is applied to the tip of the first plunger 120. Then, this force is released. As a result, the first plunger 120 is biased upward by the spring 112. The first plunger 120 moves upward by the biasing of the spring 112. After the first plunger 120 is moved, the horizontal deviation Δx of the position of the tip of the first plunger 120 from the design position and the vertical deviation Δy of the position of the tip of the first plunger 120 from the design position are measured. Then, the deviation Δ is calculated based on Expression (1).

In the repeated measurements according to the embodiment, the calculation of the deviation Δ was performed five times for each of 40 pieces of first plungers 120 by the above-described method and the average value of the deviation Δ in the five times was calculated. The box plot of the embodiment shown in FIG. 4 shows the average value of the deviation Δ for the 40 pieces of the first plungers 120.

The repeated measurements according to the comparative example were also performed in the similar manner to the repeated measurements according to the embodiment.

As shown in FIG. 4, the third quartile of the deviation Δ in the embodiment is less than the median value of the deviation Δ in the comparative example. This result suggests that the positional accuracy of the tip of the first plunger 120 can be improved when the tapered hole 238 supports the plurality of portions of the first plunger 120 as compared with when the tapered hole 238K supports only one portion of the first plunger 120K.

Hitherto, the embodiment of the present invention has been described above with reference to the drawings, but these are examples of the present invention, and various configurations other than the above description may be adopted.

For example, the tapered hole 238 supports two portions of the first plunger 120 in the vertical direction with the tip of the first plunger 120 opened and the first plunger 120 biased upward in the embodiment. Specifically, the tapered hole 238 supports the tapered portion 124 and the flange 122. The portion of the first plunger 120 supported by the tapered hole 238 in the vertical direction, however, is not limited to the two portions of the tapered portion 124 and the flange 122. The tapered hole 238 may support three or more portions of the first plunger 120 in the vertical direction. The positions of the three or more portions in the vertical direction are offset from each other in the vertical direction.

The edge between the upper surface and the outer side surface of the flange 122 is in contact with the inner side surface of the tapered hole 238 with the tip of the first plunger 120 opened and the first plunger 120 biased upward in the embodiment. A wide portion different from the flange 122 and the tapered portion 124, however, may be provided between the upper surface of the flange 122 and the lower surface of the tapered portion 124. The value of the diameter of the wide portion in the horizontal direction is greater than the value of the diameter of the lower end of the tapered portion 124 in the horizontal direction. The wide portion may contact the inner side surface of the tapered hole 238 with the tip of the first plunger 120 opened and the first plunger 120 biased upward. Also in this example, the tapered hole 238 can support the wide portion with the first plunger 120 substantially parallel to the vertical direction as the wide portion contacts the tapered hole 238.

The tapered hole 238 located between the upper end of the first through-hole 232 and the lower end of the second through-hole 234 in the vertical direction supports the plurality of portions of the first plunger 120 located above the tube 110 in the embodiment. The support of the first plunger 120 in the embodiment, however, can also be applied to the support of the second plunger 130. That is, the tapered hole may be located between the lower end of the first through-hole 232 and the upper end of the third through-hole 236 in the vertical direction. The value of the diameter of the tapered hole in the horizontal direction decreases from the lower end of the first through-hole 232 toward the upper end of the third through-hole 236. The tapered hole may support a plurality of portions of the second plunger 130 in the vertical direction.

According to the present specification, the following aspects are provided.

Aspect 1

Aspect 1 is a probe head including a probe, and an insulating support provided with a tapered hole to support a plurality of portions of the probe.

According to Aspect 1, the probe can be less prone to incline with respect to the depth direction of the tapered hole as compared with when the tapered hole supports only one portion of the probe. For this reason, the positional accuracy of the tip of the probe can be improved according to Aspect 1 as compared with when the tapered hole supports only one portion of the probe.

Aspect 2

Aspect 2 is the probe head described in Aspect 1, in which the plurality of portions of the probe includes a tapered portion having a tapered angle less than a tapered angle of the tapered hole.

According to Aspect 2, the tapered hole can support the tapered portion with the probe substantially parallel to the depth direction of the tapered hole as the tapered portion contacts the tapered hole.

Aspect 3

Aspect 3 is the probe head described in Aspect 2, in which the plurality of portions of the probe includes a wide portion having a width wider than the tapered portion.

According to Aspect 3, the tapered hole can support the wide portion with the probe substantially parallel to the depth direction of the tapered hole as the wide portion contacts the tapered hole.

Aspect 4

Aspect 4 is the probe head described in Aspect 3, in which a peripheral portion of the tapered portion of the wide portion is substantially parallel to a direction perpendicular to an extension direction of the probe.

If the peripheral portion of the tapered portion of the wide portion is inclined with respect to the direction perpendicular to the extension direction of the probe, the variation in the inclination of the peripheral portion of the wide portion may be relatively large. If the peripheral portion of the wide portion of the tapered portion is inclined with respect to the direction perpendicular to the extension direction of the probe, the variation in the measurement of the probe may be relatively large. According to Aspect 4, on the other hand, the variation in the inclination and the variation in the measurement can be reduced as compared with when the peripheral portion of the tapered portion of the wide portion is inclined with respect to the direction perpendicular to the extension direction of the probe. Accordingly, the probe is easily processed according to Aspect 4 as compared with when the peripheral portion of the tapered portion of the wide portion is inclined with respect to the direction perpendicular to the extension direction of the probe.

REFERENCE SIGNS LIST

10, 10K probe head, 20 object under inspection, 22 first electrode, 30 inspection substrate, 32 second electrode, 100 probe, 110 tube, 112 spring, 120, 120K first plunger, 122, 122K flange, 122*a* increased diameter region, 124, 124K tapered portion, 126, 126K first column portion, 128 first contact portion, 130 second plunger, 136 second column portion, 138 second contact portion, 200 insulating support, 210 first insulating support, 220 second insulating support, 230 through-hole, 232, 232K first through-hole, 234, 234K second through-hole, 236 third through-hole, 238, 238K tapered hole, IL virtual line

The invention claimed is:

1. A probe head comprising:

a probe; and an insulating support provided with a tapered hole to support the probe, wherein the probe includes:

a tapered portion decreasing in diameter from one end side to the other end side of the tapered portion; and a wide portion including a region located around the one end side of the tapered portion, the region of the wide portion is substantially parallel to a direction perpendicular to an extension direction of the probe, the wide portion of the probe has a width wider than a diameter of the one end side of the tapered portion of the probe, the tapered hole of the insulating support includes an inner side surface and an edge, the edge being at a boundary between the tapered hole and a through-hole communicating with the tapered hole, the inner side surface of the tapered hole and the edge of the tapered hole define a dual-contact interface that simultaneously supports the wide portion of the probe and the tapered portion of the probe, respectively, through direct physical contact between the inner side surface and the wide portion and between the edge and the tapered portion, and the tapered portion of the probe has a tapered angle less than a tapered angle of the tapered hole.

2. The probe head according to claim 1, wherein the wide portion includes an upper surface and an outer side surface, and wherein the direct physical contact between the inner side surface of the tapered hole and the wide portion occurs at a peripheral edge of the wide portion located between the upper surface and the outer side surface of the wide portion.

3. The probe head according to claim 1, wherein the tapered portion and the wide portion are contiguous with one another.

4. The probe head according to claim 1, wherein a length of the tapered portion in the extension direction of the probe is longer than a length of the tapered hole in the extension direction of the probe.

5. The probe head according to claim 1, wherein the edge is an annular edge extending continuously around the through-hole, and the direct physical contact between the edge of the tapered hole and the tapered portion occurs continuously along a circumference of the tapered portion.

6. A probe head comprising:

a probe; and an insulating support provided with a tapered hole to support the probe, wherein the probe includes:

a tapered portion decreasing in diameter from one end side to the other end side of the tapered portion; and a wide portion including a region located around the one end side of the tapered portion, the region of the wide portion is substantially parallel to a direction perpendicular to an extension direction of the probe, the wide portion of the probe has a width wider than a diameter of the one end side of the tapered portion of the probe, the tapered hole of the insulating support includes an inner side surface and an edge, the edge being at a boundary between the tapered hole and a through-hole communicating with the tapered hole, the inner side surface of the tapered hole and the edge of the tapered hole define a dual-contact interface that simultaneously supports the wide portion of the probe and the tapered portion of the probe, respectively, through direct physical contact between the inner side surface and the wide portion and between the edge and the tapered portion, and the tapered portion and the wide portion are contiguous with one another.

7. The probe head according to claim 6, wherein the wide portion includes an upper surface and an outer side surface, and wherein the direct physical contact between the inner side surface of the tapered hole and the wide portion occurs at a peripheral edge of the wide portion located between the upper surface and the outer side surface of the wide portion.

8. The probe head according to claim 6, wherein a length of the tapered portion in the extension direction of the probe is longer than a length of the tapered hole in the extension direction of the probe.

9. The probe head according to claim 6, wherein the edge is an annular edge extending continuously around the through-hole, and the direct physical contact between the edge of the tapered hole and the tapered portion occurs continuously along a circumference of the tapered portion.

10. A probe head comprising:

a probe; and an insulating support provided with a tapered hole to support the probe, wherein the probe includes:

a tapered portion decreasing in diameter from one end side to the other end side of the tapered portion; and a wide portion including a region located around the one end side of the tapered portion, the region of the wide portion is substantially parallel to a direction perpendicular to an extension direction of the probe, the wide portion of the probe has a width wider than a diameter of the one end side of the tapered portion of the probe, the tapered hole of the insulating support includes an inner side surface and an edge, the edge being at a boundary between the tapered hole and a through-hole communicating with the tapered hole, the inner side surface of the tapered hole and the edge of the tapered hole define a dual-contact interface that simultaneously supports the wide portion of the probe and the tapered portion of the probe, respectively, through direct physical contact between the inner side surface and the wide portion and between the edge and the tapered portion, the edge is an annular edge extending continuously around the through-hole, and the direct physical contact between the edge of the tapered hole and the tapered portion occurs continuously along a circumference of the tapered portion.

11. The probe head according to claim 10, wherein the wide portion includes an upper surface and an outer side surface, and wherein the direct physical contact between the inner side surface of the tapered hole and the wide portion occurs at a peripheral edge of the wide portion located between the upper surface and the outer side surface of the wide portion.

12. The probe head according to claim 10, wherein a length of the tapered portion in the extension direction of the probe is longer than a length of the tapered hole in the extension direction of the probe.

* * * * *